(12) United States Patent
Sachdev et al.

(10) Patent No.: US 7,643,329 B2
(45) Date of Patent: Jan. 5, 2010

(54) ASYMMETRIC FOUR-TRANSISTOR SRAM CELL

(75) Inventors: Manoj Sachdev, Waterloo (CA); Mohammad Sharifkhani, Kitchener (CA)

(73) Assignee: CertiChip Inc., Waterloo, Ontario (CA)

( * ) Notice: Subject to any disclaimer, the term of this patent is extended or adjusted under 35 U.S.C. 154(b) by 272 days.

(21) Appl. No.: 11/621,679

(22) Filed: Jan. 10, 2007

(65) Prior Publication Data

US 2007/0177419 A1    Aug. 2, 2007

(51) Int. Cl.
    *G11C 11/00*    (2006.01)
(52) U.S. Cl. .................. 365/154; 365/155; 365/156
(58) Field of Classification Search .......... 365/156, 365/155, 154
    See application file for complete search history.

(56) References Cited

U.S. PATENT DOCUMENTS

| | | | |
|---|---|---|---|
| 6,483,739 B2 * | 11/2002 | Houston | 365/154 |
| 6,552,923 B2 * | 4/2003 | Houston | 365/154 |
| 6,731,533 B2 * | 5/2004 | Deng et al. | 365/154 |
| 6,920,061 B2 * | 7/2005 | Bhavnagarwala et al. | 365/154 |
| 2003/0035331 A1 | 2/2003 | Foss et al. | |
| 2005/0068824 A1 | 3/2005 | Houmura et al. | |
| 2005/0207212 A1 | 9/2005 | Tsujimura et al. | |

OTHER PUBLICATIONS

Internaltion Search Report and Written Opinion dated Apr. 24, 2007, pertaining to PCT Patent Application No. PCT/CA2007/000033.

* cited by examiner

*Primary Examiner*—Pho M. Luu

(57) ABSTRACT

An asymmetric Static Random Access Memory (SRAM) cell is provided. The SRAM cell comprises first and second storage nodes, drive transistors and access transistors. The first and second storage nodes are configured to store complementary voltages. The drive transistors are configured to selectively couple each of the first and second storage nodes to corresponding high and low voltage power supplies, and maintain a first logic state through a feedback loop. The access transistors are configured to selectively couple each of the first and second storage nodes to corresponding first and second bit-lines and maintain a second logic state through relative transistor leakage currents. A method for reading from and writing to the SRAM cell are also provided.

16 Claims, 7 Drawing Sheets

ASYMMETRIC FOUR-TRANSISTOR SRAM CELL

The present invention relates generally to four-transistor Static Random Access Memory (SRAM) cells and specifically to an improved asymmetric four-transistor SRAM cell topology.

BACKGROUND

Static Random Access Memories (SRAMs) are one of the most popular ways to store data in electronic systems. Similarly, embedded SRAMs are a vital building block in integrated circuits. SRAMs are popular due to a relatively high speed, robust design and ease of integration. However, SRAMs, in general, occupy a significantly large portion of a chip's die area, making it an important block in terms of area, yield, reliability and power consumption. With increasing demand for highly integrated System on Chip designs, improving various aspects of embedded SRAMs has received significant interest.

A six-transistor (6T) SRAM cell is a popular configuration because of its high speed and robustness. This configuration, however, suffers from relatively high area due to the large number of transistors. Large cell area leads to longer bit-lines, word-lines and other control wires that run across an SRAM array. A long wire has relatively large capacitive load which either increases the dynamic power consumption or reduces the operational speed. Therefore, reducing the size of an SRAM cell is important and researchers have proposed several methods and techniques to do so.

Dynamic random access memory (DRAM) cells, which require less area than SRAMs have been developed. However, DRAMs require a special semiconductor manufacturing process and are, therefore, not easily integrated with conventional complementary metal-oxide-semiconductor (CMOS) digital circuits.

Conventional four-transistor (C4T) SRAMs have also been developed. Since SRAM can be implemented in a conventional CMOS technology, a C4T SRAM configuration it can easily be integrated into digital circuits. However, poor stability of the C4T cell makes its configuration less desirable.

Accordingly, it is an object of the present invention to obviate or mitigate at least some of the above-mentioned disadvantages.

SUMMARY

An asymmetric, four-transistor (A4T) SRAM cell topology provides an improved cell stability and reduced cell read time as compared to the conventional 4T cell topology. Further, the A4T SRAM cell topology provides a reduced cell area as compared to conventional 6T SRAM cells, thereby allowing a higher cell density.

In accordance with an aspect of the present invention there is provided a Static Random Access Memory (SRAM) cell comprising: first and second storage nodes configured to store complementary voltages; drive transistors configured to selectively couple each of the first and second storage nodes to corresponding high and low voltage power supplies, and maintain a first logic state through a feedback loop; and access transistors configured to selectively couple each of the first and second storage nodes to corresponding first and second bit-lines and maintain a second logic state through relative transistor leakage currents.

In accordance with a further aspect of the present invention there is provided A method for reading a logic value from an SRAM cell comprising first and second storage nodes configured to store complementary voltages, drive transistors configured to selectively couple each of the first and second storage nodes to corresponding high and low voltage power supplies, and access transistors configured to selectively couple each of the first and second storage nodes to corresponding first and second bit-lines, the method comprising the steps of: pre-charging the bit-lines to a predetermined pre-charge voltage; accessing the cell by activating at least one of the access transistors; and sensing a change on the corresponding bit-line to determine the logic value stored in the cell.

BRIEF DESCRIPTION OF THE DRAWINGS

Embodiments of the invention will now be described by way of example only with reference to the following drawings in which.

DETAILED DESCRIPTION OF THE PREFERRED EMBODIMENTS

Figure 1:
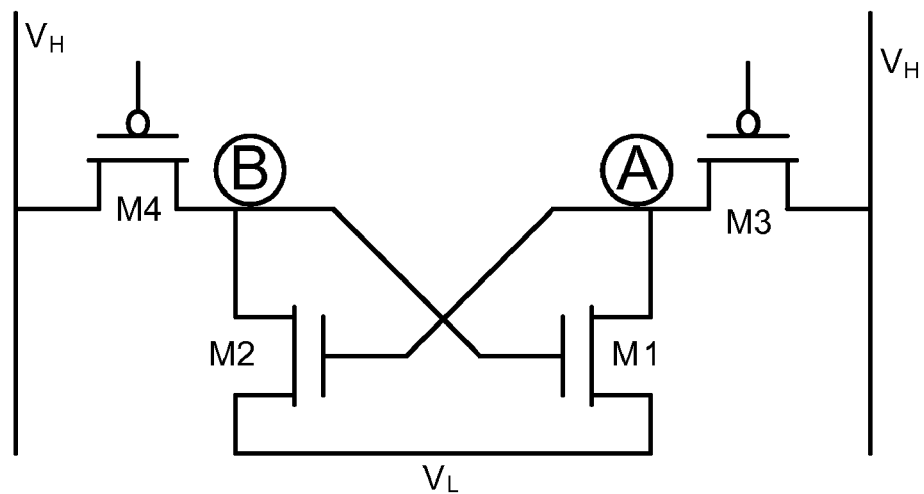
FIG. 1 is a circuit diagram illustrating a conventional 4T SRAM cell.

For convenience, like numerals in the description refer to like structures in the drawings. Referring to FIG. 1, a conventional four-transistor (C4T) SRAM cell is illustrated generally by numeral 100.

The C4T cell 100 comprises a pair of access p-channel metal-oxide-semiconductor (PMOS) transistors M4 and M3 and a pair of drive n-channel metal-oxide-semiconductor (NMOS) transistors M1 and M2.

The C4T cell 100 is coupled between a pair of complementary bit-lines BL and $\overline{BL}$. Specifically, the access transistor M3 and the drive transistor M1 are serially coupled between one of the bit-lines $\overline{BL}$ and ground $V_L$, respectively. Similarly, the access transistor M4 and the drive transistor M2 are serially coupled between the other bit-lines BL and ground $V_L$, respectively. The gate of drive transistor M2 is coupled to node A, located between the access transistor M3 and the drive transistor M1. The gate of drive transistor M1 is coupled to node B, located between the access transistor M4 and the drive transistor M2. The gates of access transistors M3 and M4 are coupled to a word-line (not shown).

Accordingly, the C4T cell is able to store two states on its internal nodes A and B when the access transistors M3 and M4 are turned off. For example, when node A carries a high voltage $V_H$ it turns on drive transistor M2. In turn, drive transistor M2 forces a low voltage $V_L$ at node B. This effect results in a gate source voltage Vgs of drive transistor M1 to be equal to zero volts. Hence drive transistor M1 remains off. The pre-charge voltage $V_H$ of the bit-line pair BL and $\overline{BL}$ will remain at node A as long as the leakage current through access transistor M3 overcomes that of drive transistor M1.

In this configuration the stability of the cell depends on the relative leakage through access and driver transistors. Therefore, threshold voltage fluctuations of NMOS and PMOS transistors can affect the stability of the cell significantly. For example, if node A stores a high voltage $V_H$ and node B stores a low voltage $V_L$, a higher threshold voltage for access transistor M3 or a lower threshold voltage for drive transistor M1 may result in a poor stability at node A. In addition, the Vgs of drive transistor M1 is equal to zero volts at best and, therefore, it is difficult to control the leakage through circuit means. If, due to an imperfection, node A cannot hold a proper high voltage $V_H$, the node voltage will drop. This drop affects the current of driver transistor M2, which results in poor stability at node B, as well as slower and non-robust read operation. In extreme circumstances, the positive feedback in the C4T cell 100 may force the C4T cell 100 to lose its data.

In accordance with present embodiment an asymmetric four-transistor (A4T) SRAM cell is provided. The A4T SRAM cell operates asymmetrically in holding a logic one and logic zero and occupies a smaller area than a common six transistor SRAM cell. Further, A4T SRAM cell is more stable than conventional four-transistor SRAM cells.

In the proposed configuration, the A4T cell comprises of two NMOS and two PMOS transistors. The transistors are connected such that they have two internal nodes, which are each capable of holding two states. One NMOS transistor and one PMOS transistor are used as access transistors, which connect the internal nodes to a complementary bit-line pair. The other PMOS and NMOS transistors are used as drive transistors. The PMOS drive transistor connects one of the two internal nodes to a high voltage $V_H$ and the NMOS drive transistor connects the other internal node to a low voltage $V_L$. The pre-charge voltages of the bit-lines are set accordingly.

Figure 2:
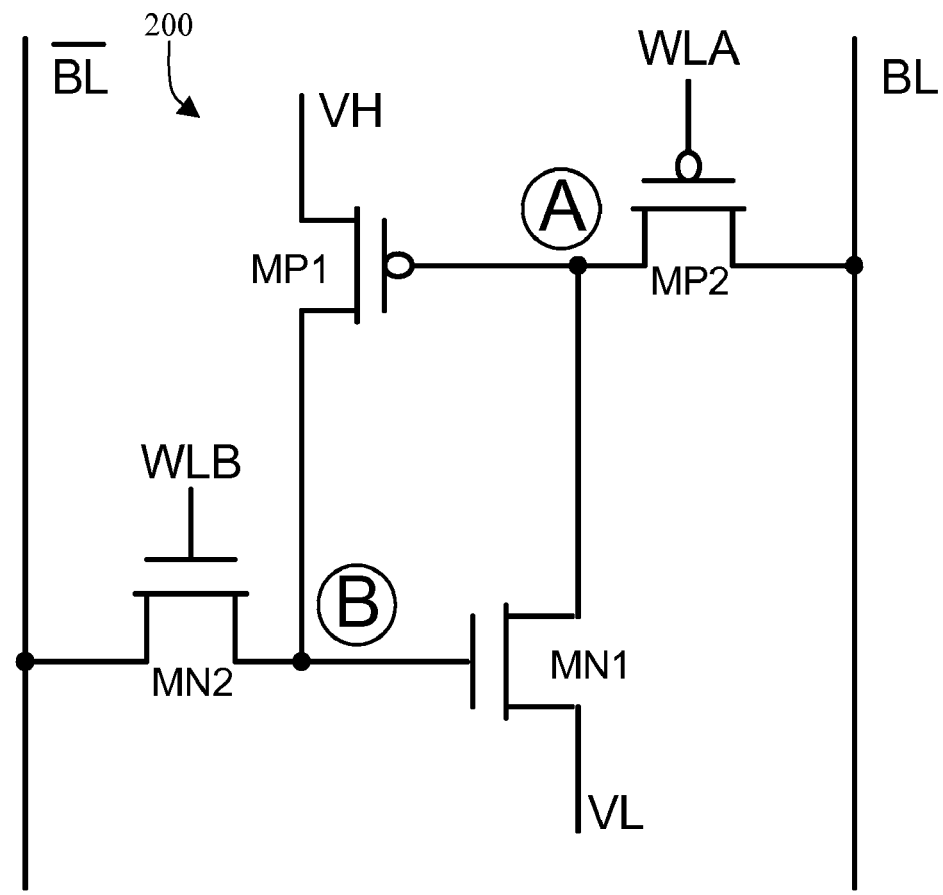
FIG. 2 is a circuit diagram illustrating an asymmetric 4T SRAM cell in accordance with one embodiment.

Referring to FIG. 2, an implementation of the A4T SRAM cell (also referred to hereafter as "the cell") is illustrated by numeral 200. The cell 200 comprises two PMOS transistors MP1 and MP2, two NMOS transistors MN1 and MN2, and two internal nodes A and B. The cell 200 is coupled between a complementary bit-line pair BL and $\overline{BL}$. Further, cell 200 access is facilitated by a word-line pair WL and $\overline{WL}$.

The drain terminals of transistors MN1 and MP2, and the gate terminal of transistor MP1 are electrically connected at node A. Similarly, the drain terminals of transistors MN2 and MP1, and the gate terminal of MN1 are electrically connected at node B.

The source terminals of transistors MN1 and MP1 are coupled to a low voltage supply $V_L$ and a high voltage supply $V_H$, respectively, and are referred to as the drive transistors. The gate terminals of MN1 and MP1 are driven by nodes B and A, respectively. Therefore, there is an internal loop between the internal nodes of the circuit through the drive transistors.

The source terminals of transistors MN2 and MP2 are coupled to the bit-line pair $\overline{BL}$ and BL, respectively, and are referred to as the access transistors. A nominal high pre-charge voltage $VBL_H$ of the bit-line BL is a high voltage and a nominal low pre-charge voltage $VBL_L$ of the bit-line $\overline{BL}$ is a low voltage.

The gate terminals of transistors MN2 and MP2 are driven by complementary word-line signals WLB and WLA, respectively. The cell can be accessed when either one or both of the access transistors MN2 and MP2 are turned on. As will be appreciated, this may improve the stability of the cell 200 during a read operation, as it is less exposed to the outside influence of the bit-lines $\overline{BL}$ and BL.

Since transistor MP2 is a PMOS transistor the voltage $V_{WLA}$ of the word-line WLA is reduced to turn on transistor MP2. Conversely, since transistor MN2 is an NMOS transistor, the voltage $V_{WLB}$ the word-line WLB is increased to turn on transistor MN2. The voltage level applied to the gate terminal of the access transistors MN2 and MP2 can differ for read and write access.

Bit Storage

The cell 200 operates asymmetrically holding a logic one and a logic zero when is not accessed. In the present embodiment, the cell is considered to hold a logic one if the voltage at node A is higher than the voltage at node B. The cell is considered to hold a logic zero if the voltage at node B is higher than the voltage at node A.

In order for the cell 200 to hold the logic zero, drive transistors MP1 and MN1 should be on. When MN1 and MP1 are on, they construct a positive feedback loop. This loop improves the stability of the cell 200 such that it can hold the state under transistor threshold voltage fluctuation.

The cell holds the logic one when both drive transistors MP1 and MN1 are off. Leakage currents through the access transistors MP2 and MN2 are sufficiently high to keep the internal nodes A and B close to the corresponding pre-charged bit-line voltages. In this case, since the access transistors MP2 and MN2 dominate the internal node voltages of nodes A and B, the voltage appearing at these two nodes will be close to the high voltage $VBL_H$ of bit-line BL and the low voltage $VBL_L$ of $\overline{BL}$, respectively. Since $VBL_H$ is kept higher than $VBL_L$ the cell 200 holds a logic one.

Cell Access

In order for access transistor MP2 to turn on, the voltage on word-line WLA has to drop to a sufficiently low voltage. In the present example, this voltage is $VBL_H - Vth_{P2}$ or lower, where $Vth_{P2}$ is the threshold voltage of access transistor MP2.

In order for access transistor MN2 to turn on, the voltage on word-line WLA has to rise to a sufficiently high voltage. In the present example, this voltage is $VBL_H + Vth_{N2}$ or higher, where $Vth_{N2}$ is the threshold voltage of access transistor MN2.

When the cell 200 is to be access for either a read or write operation, the access transistors MP2 and MN2 are activated by the word-lines WLA and WLB, as described above.

Read Operation

If the cell 200 is accessed for read operation, the bit-lines BL and $\overline{BL}$ may be affected, depending on the logic value stored in the cell.

If, for example, the cell 200 stores a logic zero, node A is at a lower voltage than node B. Both drive transistors MP1 and MN1 force the corresponding bit-line voltages towards the voltage at their source terminals. That is, dive transistor MP1 sources the current towards bit-line $\overline{BL}$ and MN1 sinks current from bit-line BL. A current or voltage mode sense amplifier can be used to detect current flow on the bit-line pair BL and $\overline{BL}$.

Figure 3:
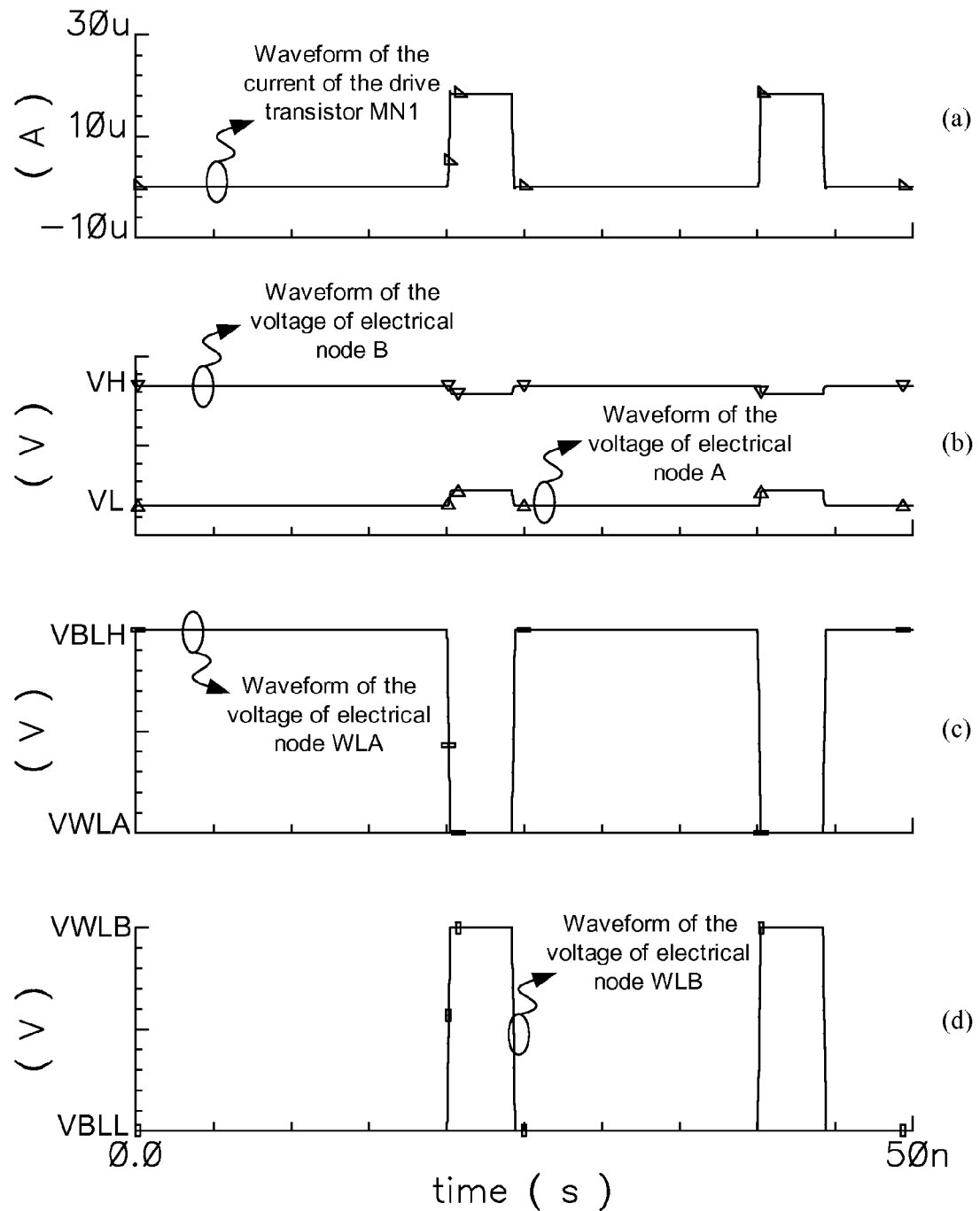
FIG. 3 is a graph illustrating a waveform plot for a read operation on a 4T SRAM cell as illustrated in FIG. 2 holding a logic zero.

Referring to FIG. 3, a waveform plot of a sample read operation for a cell 200 storing a logic zero is shown. FIG. 3a illustrates the current of the drive transistor MN1. FIG. 3b illustrates the voltage at nodes A and B. FIG. 3c illustrates the voltage at word-line WLA. FIG. 3d illustrates the voltage at word line WLB.

At a given time, the cell is accessed by reducing the voltage on word-line WLA and increasing the voltage of word-line WLB. As illustrated in FIG. 3a, the current driven through the drive transistor MN1 onto bit-line $\overline{BL}$ increases. Further, as shown in FIG. 3b, the cell 200 maintains the proper voltages at each of nodes A and B for the duration of the read operation.

If, for example the cell 200 stores a logic one, node A is at a higher voltage than node B. Both drive transistors MP1 and MN1 are off. Accordingly, when the cell 200 is accessed for a read operation there is no current passing through the drive transistors MP1 and MN1. Therefore, the corresponding bit-lines BL and $\overline{BL}$ do not experience a current flow from the cell 200. A current or voltage mode sense amplifier can be used to detect the lack of current flow on the bit-line pair BL and $\overline{BL}$.

Figure 4:
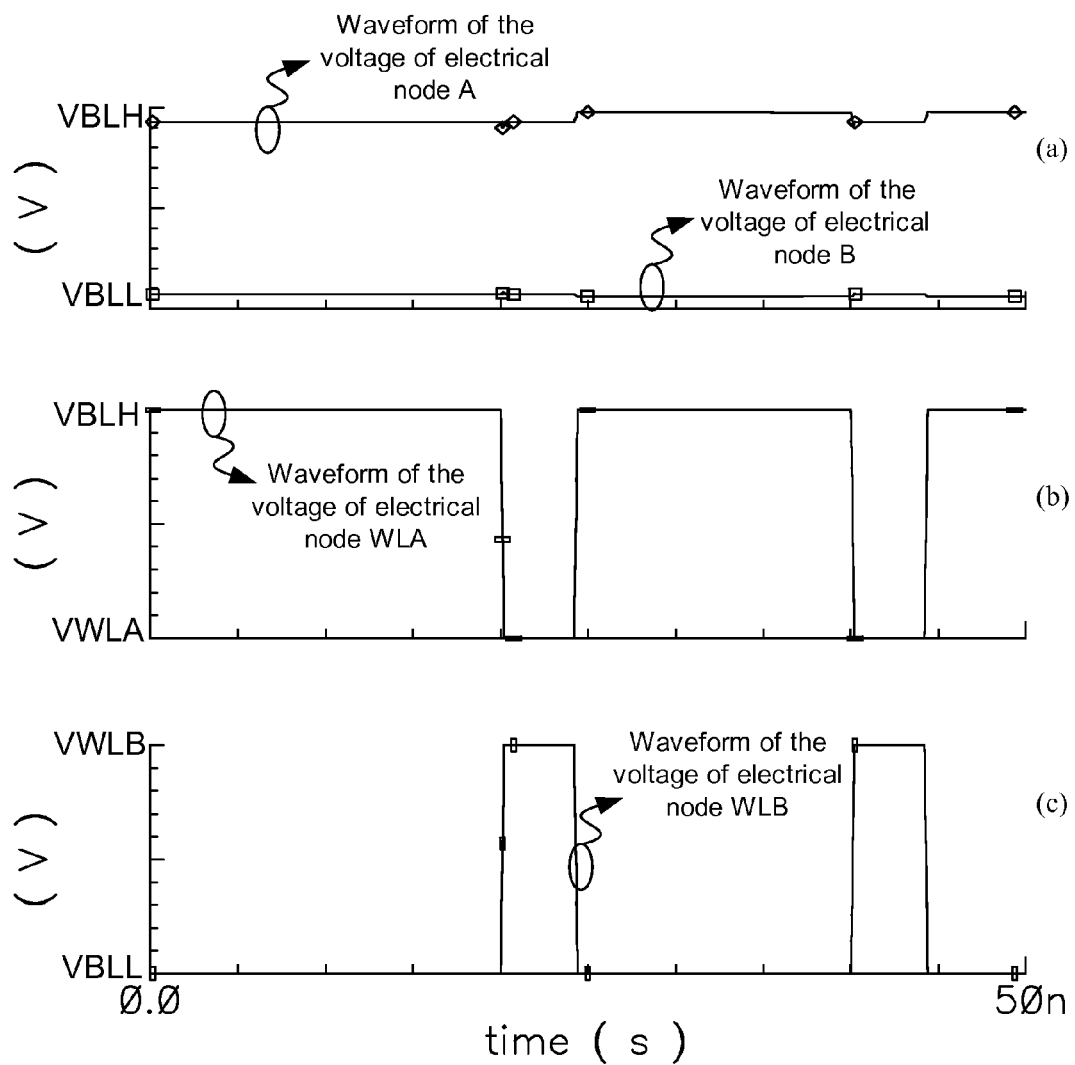
FIG. 4 is a graph illustrating a waveform plot for a read operation on a 4T SRAM cell as illustrated in FIG. 2 holding a logic one.

Referring to FIG. 4, a waveform plot of a sample read operation for a cell 200 storing a logic zero is shown. FIG. 4a illustrates the voltage at nodes A and B. FIG. 4b illustrates the voltage at word-line WLA. FIG. 4c illustrates the voltage at word line WLB.

At a given time, the cell is accessed by reducing the voltage on word-line WLA and increasing the voltage of word-line WLB. As shown in FIG. 4a, the cell 200 maintains the proper voltages at each of nodes A and B for the duration of the read operation.

Accordingly, it can be seen that accessing a cell 200 that stores a logic one reinforces the same logical value on the cell 200. In contrast, accessing a cell 200 that stores a logic zero drives current onto the bit-line pair BL and $\overline{BL}$. However, the internal loop prevents the logic value of the cell 200 from being flipped.

In an alternate embodiment, rather than use both word-lines WLA and WLB to activate both access transistors MP2 and MN2, only one of the access transistors MP2 and MN2 is activated. Experimental evidence indicates that activating only one of the access transistors MP2 and MN2 improves the stability of the cell 200 and further reduces the likelihood that the logic value of the cell 200 will flip during a read operation.

Write Operation

The following describes a write operation to the cell 200. If the logic value being written to the cell 200 is the same as the logic value already stored therein, little happens. Accordingly, the write operation will be will described for a cell 200 that stores an opposite value of the logic value to be written.

If, for example, the cell 200 stores a logic one and a logic zero is to be written to the cell 200, the write operation is described as follows. The state of the cell 200 can be flipped to a logic zero if the voltage applied to the bit-line BL is sufficiently below the high voltage supply $V_H$ of the cell 200 the voltage applied to the bit line $\overline{BL}$ is sufficiently above the low voltage supply $V_L$ of the cell 200 before the cell 200 is accessed. A sample voltage sufficiently below $V_H$ is $V_H$–$Vth_P$, where $Vth_P$ is the absolute value of the threshold voltage for drive transistor MP1. A sample voltage sufficiently above $V_L$ is $V_L$+$Vth_N$, where $Vth_N$ is the absolute value of the threshold voltage for drive transistor MN1.

Figure 5:
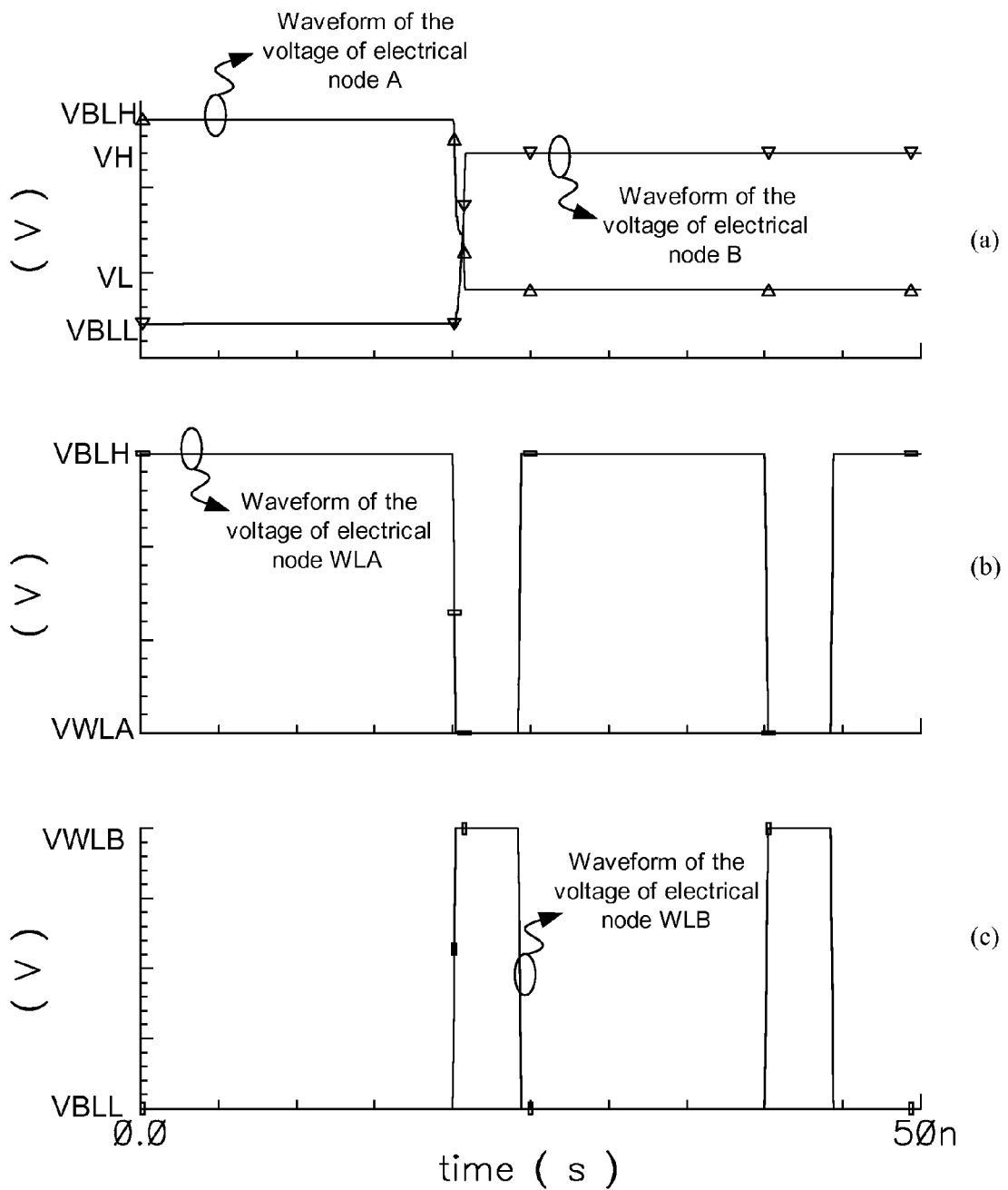
FIG. 5 is a graph illustrating a waveform plot for a write operation on a 4T SRAM cell as illustrated in FIG. 2 for writing a logic zero.

Referring to FIG. 5, a waveform plot of a sample logic zero write operation for a cell 200 storing a logic one is shown. FIG. 5a illustrates the voltage at nodes A and B. FIG. 5b illustrates the voltage at word-line WLA. FIG. 5c illustrates the voltage at word line WLB. Once the bit-lines have been sufficiently pre-charged to the voltages, as described above, the cell 200 is accessed by decreasing the voltage on word-line WLA and increasing the voltage on word-line WLB.

In the present example, the voltage applied to the word-lines WLA and WLB is the same voltage that is applied for a read operation. The voltage on bit-line BL is sufficiently low to turn on drive transistor MP1. Similarly, the voltage on bit-line $\overline{BL}$ is sufficiently high to turn on drive transistor MN1. Therefore, the voltage at node A is driven to low voltage $V_L$ by drive transistor MN1 and the voltage at node B is drive to high voltage $V_H$ by drive transistor MP1. The logic zero is maintained by the internal loop of the cell 200.

If, for example, the cell 200 stores a logic zero and a logic one is to be written to the cell 200, the write operation is described as follows. The state of the cell 200 can be flipped to a logic one if the voltage applied to the bit-lines BL and $\overline{BL}$ overcomes the drive of the drive transistors MP1 and MN1 and turns them off. This operation can be accomplished in a number of ways.

One way to accomplish this operation is to increase the overdrive voltage of the access transistors MN2 and MP2 such that the charge introduced into the loop from the bit lines BL and $\overline{BL}$ when they are activated turns off the drive transistors MN1 and MP1. Since the high voltage supply $V_H$ and the low voltage supply $V_L$ can differ from high bit-line voltage $VBL_H$ and the low bit line voltage $VBL_L$, a negative gate source voltage can be generated over the drive transistors MN1 and MP1.

Figure 6:
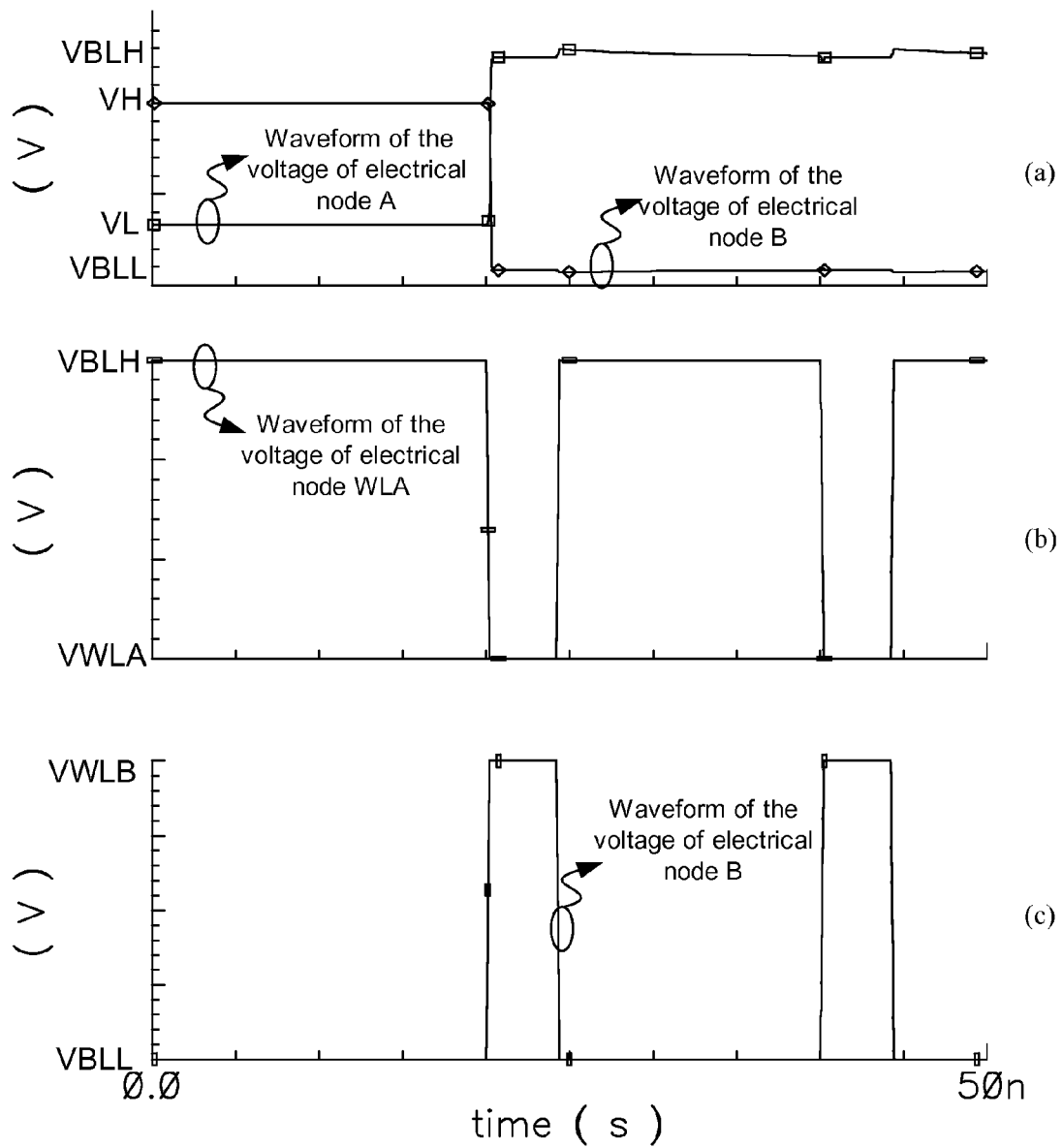
FIG. 6 is a graph illustrating a waveform plot for a write operation on a 4T SRAM cell as illustrated in FIG. 2 for writing a logic one.

Referring to FIG. 6, a waveform plot of a sample logic one write operation for a cell 200 storing a logic zero is shown. FIG. 6a illustrates the voltage at nodes A and B. FIG. 6b illustrates the voltage at word-line WLA. FIG. 6c illustrates the voltage at word line WLB. Once the bit-lines have been sufficiently pre-charged to their nominal pre-charge voltages the cell 200 is accessed by decreasing the voltage on word-line WLA and increasing the voltage on word-line WLB.

In the present example, the voltage applied to the word-lines WLA and WLB is the same voltage that is applied for a read operation. The voltage on bit-line BL is sufficiently high to turn off drive transistor MP1. Similarly, the voltage on bit-line $\overline{BL}$ is sufficiently low to turn off drive transistor MN1. Therefore, the voltage at node A is maintained at a high voltage $VBL_H$ by virtue of the access transistor MP2 being turned on. Similarly, the voltage at node B is maintained at a high voltage $VBL_L$ by virtue of the access transistor MN2 being turned on. Once the access transistors MN2 and MP2 are turned off, the voltages at nodes A and B are maintained by the leakage current through the access transistors MN2 and MP2 as described with reference to storing a logical one in a cell 200.

Figure 7:
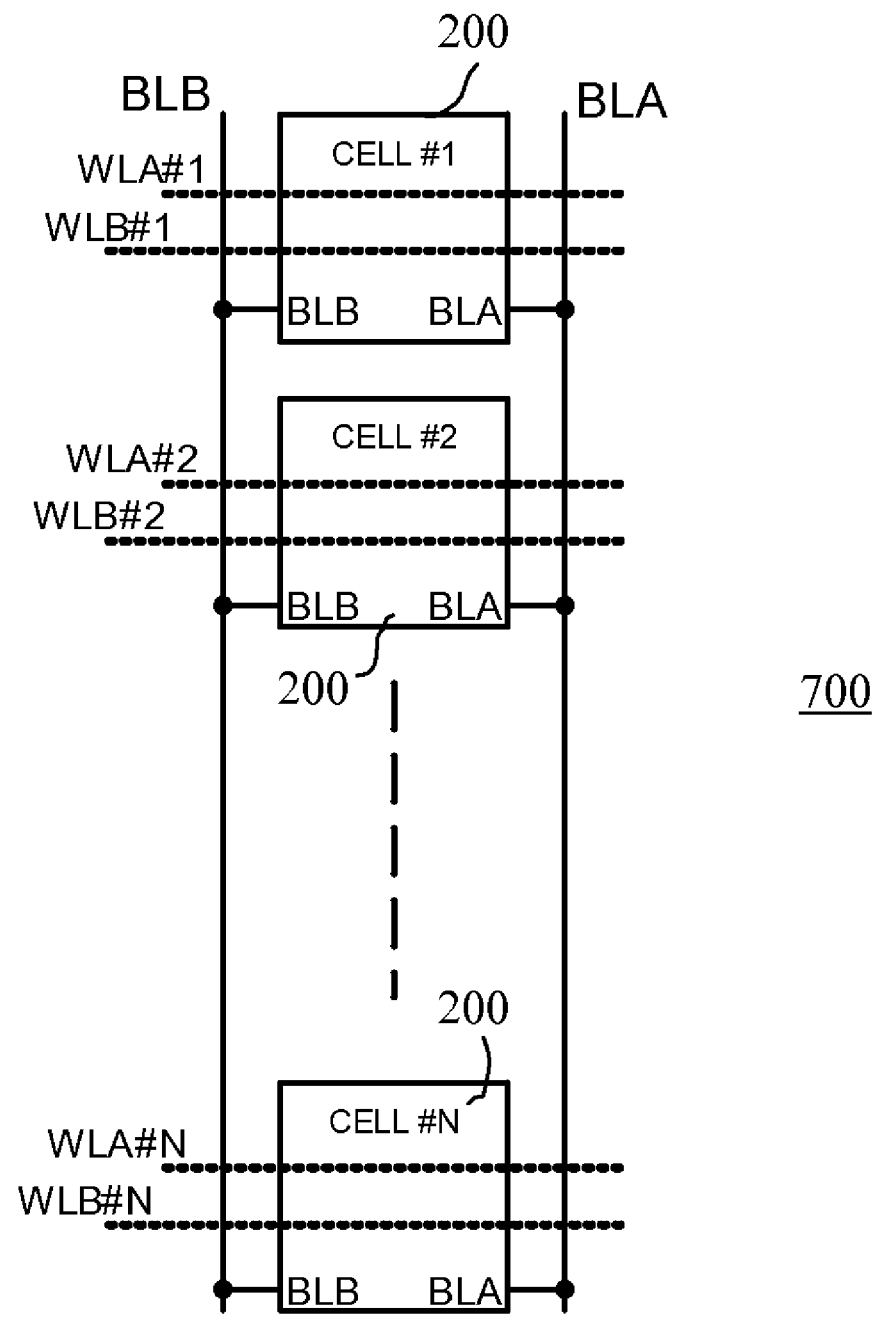
FIG. 7 is a block diagram illustrating a column of 4T SRAM cells illustrated in FIG. 2.

Referring to FIG. 7, a block diagram illustrating a column of cells 200 is shown generally by numeral 700. The column 700 illustrates an example how a plurality of the cells 200 can be organized. The bit-lines are shared among the cells 200 located on the column 700. Therefore, read and write operations are carried out by enabling the word-line voltages for a given cell 200 and by pre-charging the bit-line voltages appropriately. The arrangement of the column is similar to a that for standard SRAM cells, as will be appreciated by a person skilled in the art.

Figure 8:
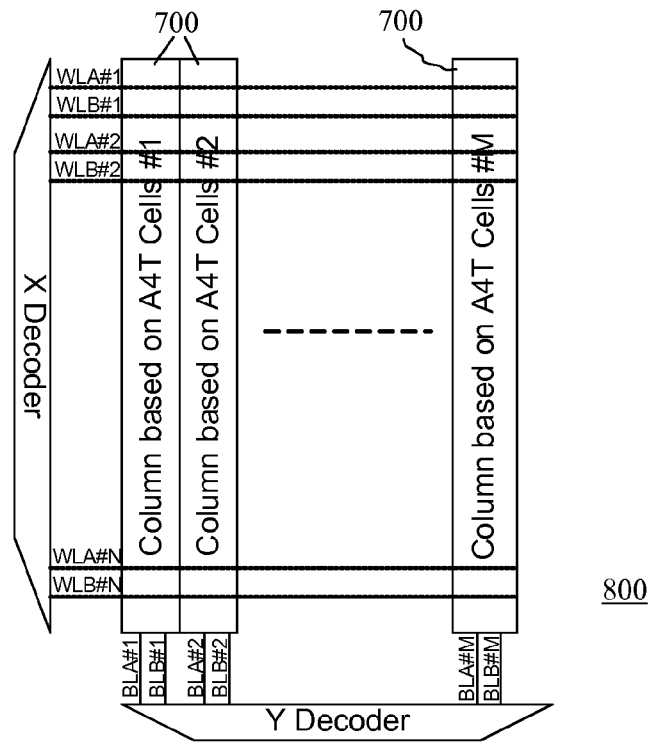
FIG. 8 is a block diagram illustrating an array of 4T SRAM cells as a plurality of columns illustrated in FIG. 7.
Figure 9:
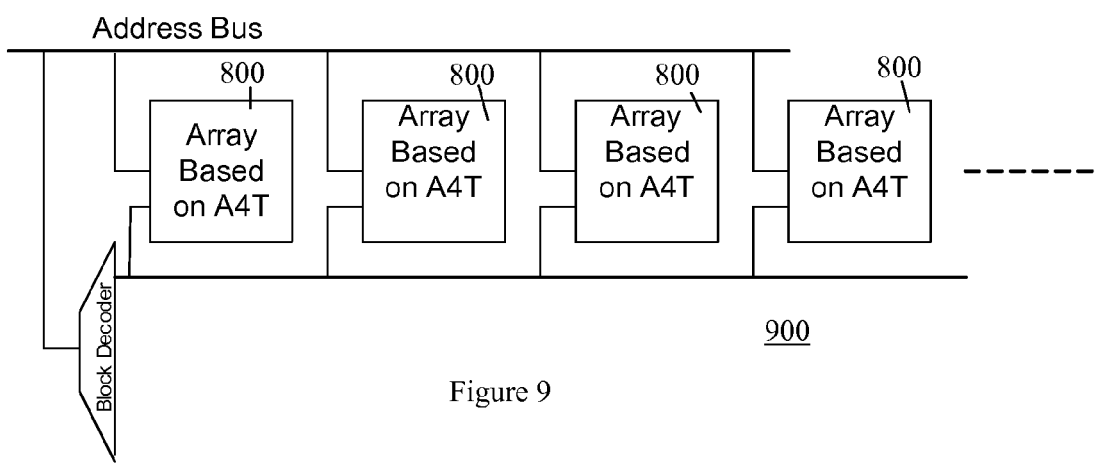
FIG. 9 is a block diagram illustrating an SRAM unit comprising a plurality of arrays illustrated in FIG. 8.

Referring to FIG. 8, a block diagram illustrating an array of cells 200 in columns 700 is shown generally by numeral 800. Referring to FIG. 9, a plurality of the arrays 800 can be organized in a complete SRAM unit. The column, array and SRAM unit configuration may include a number of different conventional configurations as well as proprietary configurations modified as necessary to work with the cell 200, as will be appreciated by a person of ordinary skill in the art.

Although the invention has been described with reference to certain specific embodiments, various modifications thereof will be apparent to those skilled in the art without departing from the scope of the invention as defined by the appended claims.

The invention claimed is:

1. A Static Random Access Memory (SRAM) cell comprising:
   first and second storage nodes configured to store complementary voltages;
   drive transistors configured to selectively couple each of the first and second storage nodes to corresponding high and low voltage power supplies, and maintain a first logic state through a feedback loop; and
   access transistors configured to selectively couple each of the first and second storage nodes to corresponding first and second bit-lines and maintain a second logic state through relative transistor leakage currents.

2. The SRAM cell of claim 1, wherein the drive transistors include a PMOS drive transistor and an NMOS drive transistor.

3. The SRAM cell of claim 2, wherein the PMOS drive transistor couples the second storage node to a high voltage power supply and the NMOS drive transistor couples the first storage node to a low voltage power supply.

4. The SRAM cell of claim 1, wherein the access transistors include a PMOS access transistor and an NMOS access transistor.

5. The SRAM cell of claim 4, wherein the PMOS access transistor couples the first storage node to the first bit-line having a high nominal pre-charge voltage and the NMOS access transistor couples the second storage node to the second bit line having a low nominal pre-charge voltage.

6. The SRAM cell of claim 4, wherein the access transistors are gated by a first and second word-lines for controlling access to the cell.

7. The SRAM cell of claim 6, wherein the first and second word-lines are configured to be operated independently of each other for a read operation.

8. The SRAM cell of claim 6, wherein the voltage required to activate the access transistors is different for a read operation than it is for a write operation.

9. The SRAM cell of claim 6, wherein the voltage levels required to activate and deactivate the NMOS access transistor is different from the voltage levels required to activate and deactivate the PMOS access transistor.

10. The SRAM cell of claim 1, wherein the value of the high voltage power supply differs from a high voltage applied to the bit-lines.

11. The SRAM cell of claim 10, wherein the value of the high voltage power supply is lower than the high voltage applied to the bit-lines.

12. The SRAM cell of claim 1, wherein the value of the low voltage power supply differs from a low voltage applied to the bit-lines.

13. The SRAM cell of claim 12, wherein the value of the low voltage power supply is higher than the low voltage applied to the bit-lines.

14. A Static Random Access Memory (SRAM) unit comprising a plurality of SRAM blocks, each block comprising an array of the SRAM cells defined in claim 1.

15. The method of claim 14, wherein the access transistors include a PMOS access transistor and an NMOS access transistor, and the PMOS access transistor is activated.

16. A method for reading a logic value from an SRAM cell comprising:
   first and second storage nodes configured to store complementary voltages, drive transistors configured to selectively couple each of the first and second storage nodes to corresponding high and low voltage power supplies, and access transistors configured to selectively couple each of the first and second storage nodes to corresponding first and second bit-lines,
   the method comprising the steps of:
   pre-charging the bit-lines to a predetermined pre-charge voltage;
   accessing the cell by activating at least one of the access transistors; and
   sensing a change on the corresponding bit-line to determine the logic value stored in the cell.

* * * * *